(12) United States Patent
Huang et al.

(10) Patent No.: US 7,394,656 B1
(45) Date of Patent: Jul. 1, 2008

(54) HEAT DISSIPATION DEVICE

(75) Inventors: Guo-He Huang, Shenzhen (CN); Li-Fu Xu, Shenzhen (CN); Ning-Yu Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 24 days.

(21) Appl. No.: 11/608,808

(22) Filed: Dec. 9, 2006

(51) Int. Cl.
*H05K 7/20* (2006.01)
*F28F 7/00* (2006.01)
*H01L 23/34* (2006.01)

(52) U.S. Cl. .................. 361/700; 165/80.3; 165/104.33; 165/121; 257/718; 257/719; 361/697; 361/719

(58) Field of Classification Search ................ 165/80.3, 165/104.33, 121; 361/697, 700, 719
See application file for complete search history.

(56) References Cited

U.S. PATENT DOCUMENTS

| | | | |
|---|---|---|---|
| 6,915,844 B2 * | 7/2005 | Chou | 165/104.33 |
| 7,100,681 B1 * | 9/2006 | Wu et al. | 165/104.33 |
| 7,269,014 B1 * | 9/2007 | Zhao et al. | 361/700 |
| 7,312,994 B2 * | 12/2007 | Lee et al. | 361/700 |
| 2005/0259405 A1 | 11/2005 | He | |
| 2006/0028798 A1 * | 2/2006 | Wang | 361/697 |
| 2007/0119566 A1 * | 5/2007 | Peng | 165/80.3 |
| 2007/0217155 A1 * | 9/2007 | Zhao et al. | 361/700 |
| 2007/0295487 A1 * | 12/2007 | Xia et al. | 165/104.33 |
| 2008/0019094 A1 * | 1/2008 | Xia et al. | 361/700 |

* cited by examiner

*Primary Examiner*—Gregory D Thompson
(74) *Attorney, Agent, or Firm*—Wei Te Chung

(57) ABSTRACT

A heat dissipation device (100) includes a base plate (10), a fin assembly (30), at least one heat pipe (40), and a pair of foot members (20) attached to the base plate. The base plate defines a top surface (12). At least one first channel (18) is defined in the top surface. The fin assembly has a first bottom surface (32). At least one second channel (38) is defined in the first bottom surface corresponding to the at least one first channel. At least one indented portion (324) is defined in the first bottom surface. The at least one heat pipe is received in the first channel and the second channel, and attached through the fin assembly. At least one foot member is attached to the at least one indented portion of the fin assembly.

19 Claims, 3 Drawing Sheets

HEAT DISSIPATION DEVICE

BACKGROUND OF THE INVENTION

1. Field of the Invention

The present invention relates to heat dissipation devices for removing heat from electronic devices, and more particularly to a heat dissipation device incorporating heat pipes for improving heat dissipation efficiency thereof.

2. Description of Related Art

As technology has advanced, the amount of heat to be dissipated from electronic components of computers has risen dramatically, while the acceptable cost of heat dissipation devices has remained constant or, in many cases, has dropped.

Conventionally, a typical heat sink conducts and dissipates heat by metal thermal conduction, and generally comprises a heat spreader for contacting a heat source, a plurality of parallel fins on the heat spreader, and two U-shaped heat pipes attached to the heat spreader and extending through the fins to transfer heat from the heat spreader to the fins. The heat sink draws heat from the heat source via the heat spreader, some of the heat is directly conducted up to the fins. The remainder is transferred to the fins via the heat pipes. Limited by inherent characteristics of metal and cost considerations, heat conduction is not sufficiently fast. Further, spreaders are large, heavy and costly.

What is needed, therefore, is a heat dissipation device which not only has simple structure but also has greater heat dissipation capability.

SUMMARY OF THE INVENTION

A heat dissipation device is used for cooling a heat generating element. The heat dissipation device includes a base plate, a fin assembly, at least one heat pipe, and a pair of foot members. The base plate defines a top surface. At least one first channel is defined in the top surface. The fin assembly has a first bottom surface. At least one second channel is defined in the first bottom surface corresponding to the at least one first channel. At least one indented portion is defined in the first bottom surface. The at least one heat pipe is received in the first channel and the second channel, and attached through the fin assembly. At least one foot member is attached to the base plate. The at least one foot member has a second bottom surface. The at least one foot member is received in the indented portion of the first bottom surface. The top surface of the base plate contacts the first bottom surface and the second bottom surface.

Other advantages and novel features will be drawn from the following detailed description of a preferred embodiment with attached drawings, in which:

DETAILED DESCRIPTION OF THE INVENTION

Figure 1:
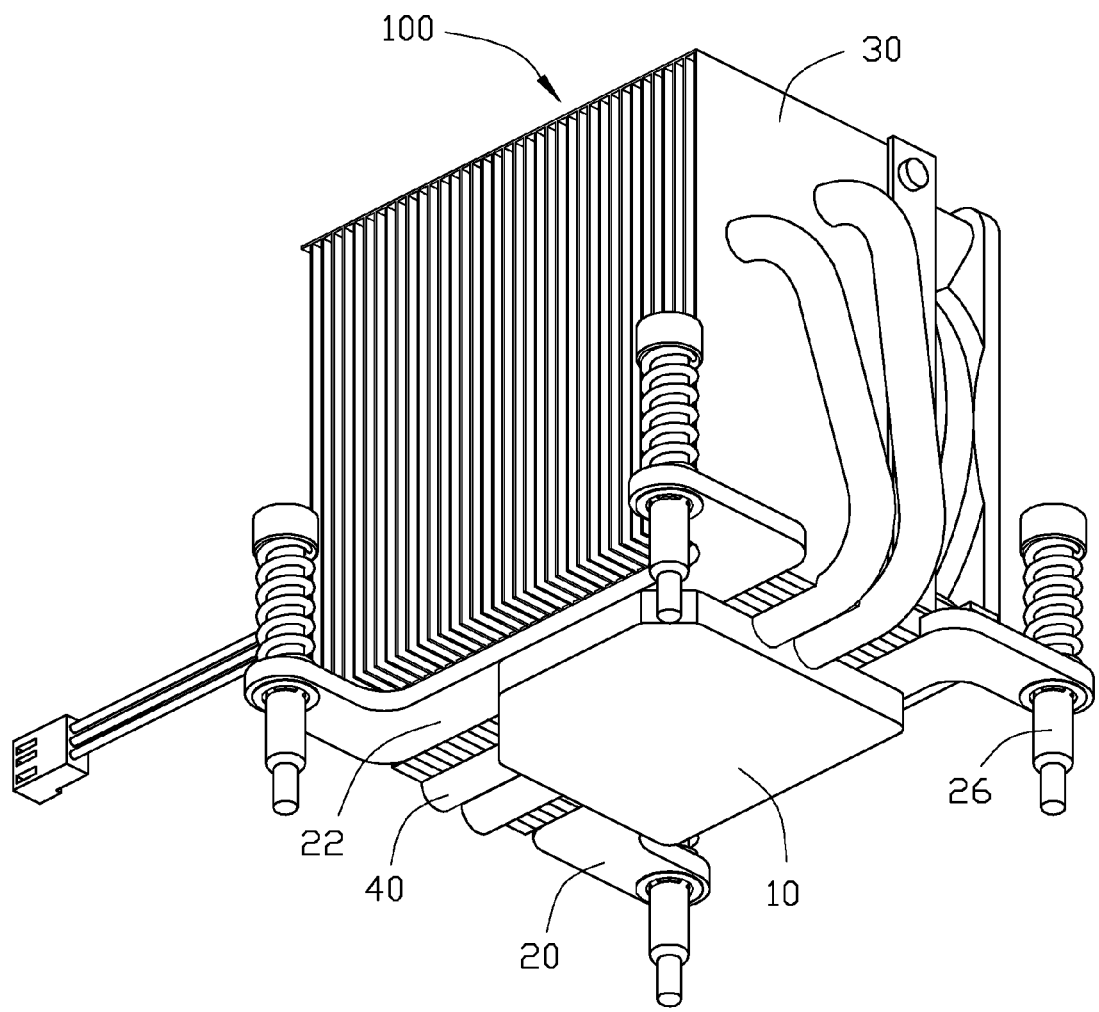
FIG. 1 is an isometric view of a heat dissipation device of a preferred embodiment of the present invention, the heat dissipation device comprising a base plate, a pair of foot members, a pair of heat pipes, a fin assembly and a fan.
Figure 2:
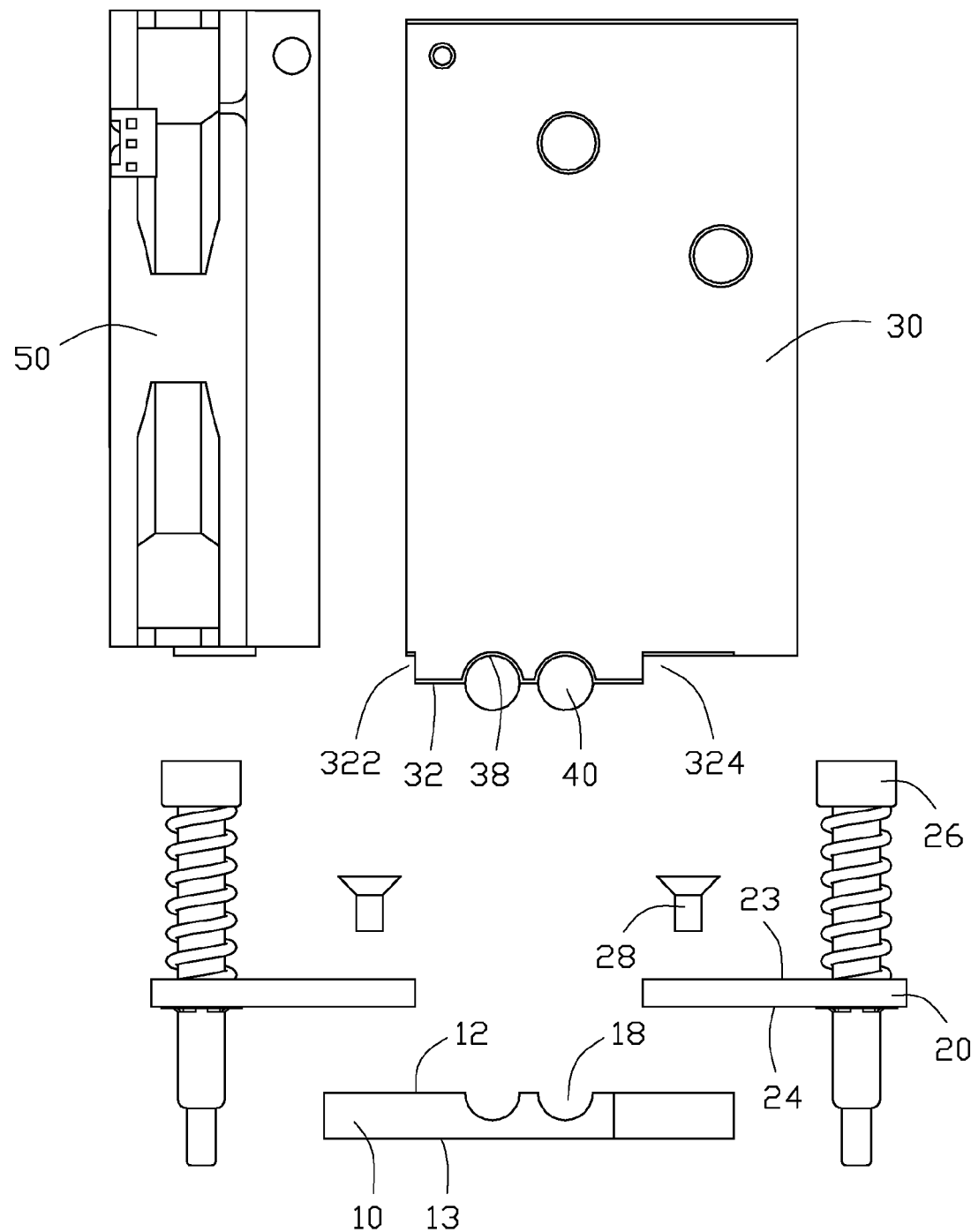
FIG. 2 is a front perspective, exploded view of the heat dissipation device of FIG. 1.

Referring to FIG. 1 and FIG. 2, a heat dissipation device 100 includes a heat-conductive base plate 10, a pair of foot members 20, a pair of heat pipes 40, a fin assembly 30 and a fan 50 attached to one side of the fin assembly 30.

The heat pipes 40 are substantially "U" shaped. Each heat pipe 40 has a top portion and a bottom portion.

The base plate 10 includes a top surface 12 and a bottom surface 13. Two channels 18 are defined in the top surface 12 for receiving the bottom portions of the heat pipes 40. The base plate 10 has a generally rectangular shape with the bottom surface approximately a same size as an exposed surface of the heat source (not shown) for lower material cost. At least one corner portion of the base plate 10 is cutoff therefrom for avoiding interference with other electric elements, which are disposed on a circuit board (not shown) near the heat source. The base plate 10 is manufactured of a material, such as copper or aluminum, which has relatively good thermal conductivity, and should be of sufficient thickness to efficiently spread heat from a heat source disposed upon its bottom surface 13 to the fin assembly 30 and the heat pipes 40 attached to its top surface 12.

The fin assembly 30 includes a plurality of fins. The fins are parallel to and spaced apart from one another a distance that is determined by the nature of the airflow between the spaces. The fin assembly 30 has a bottom surface 32. Two channels 38 are defined in the bottom surface 32 for receiving the bottom portions of the heat pipes 40 corresponding to the channels 18 of the base plate 10. A pair of indented portions 322, 324 is respectively defined in opposite sides of the bottom surface 32 of the fin assembly 30 for positioning the foot members 20. The indented portion 322 has a smaller size than that of the indented portion 324 in the direction parallel to the bottom surface 32. A projecting portion (not labeled) is therefore formed between the indented portions 322, 324. The fin assembly 30 includes notches that correspond to locations of the top portions of the heat pipes 40.

Each foot member 20 is generally "C" shaped, and has two fasteners 26 and a rivet 28 for attaching the base plate 10 to the foot member 20. Each foot member 20 has two locking holes respectively defined in opposite distal ends thereof for receiving the fasteners 26. Each foot member 20 includes a connect portion 22. The connect portion 22 parallel to the bottom portion of each heat pipe 40. The connect portion 22 defines a top surface 23 for attaching to the bottom surface 32 of the fin assembly 30 and a bottom surface 24 for attaching to the top surface 12 of the base plate 10.

Figure 3:
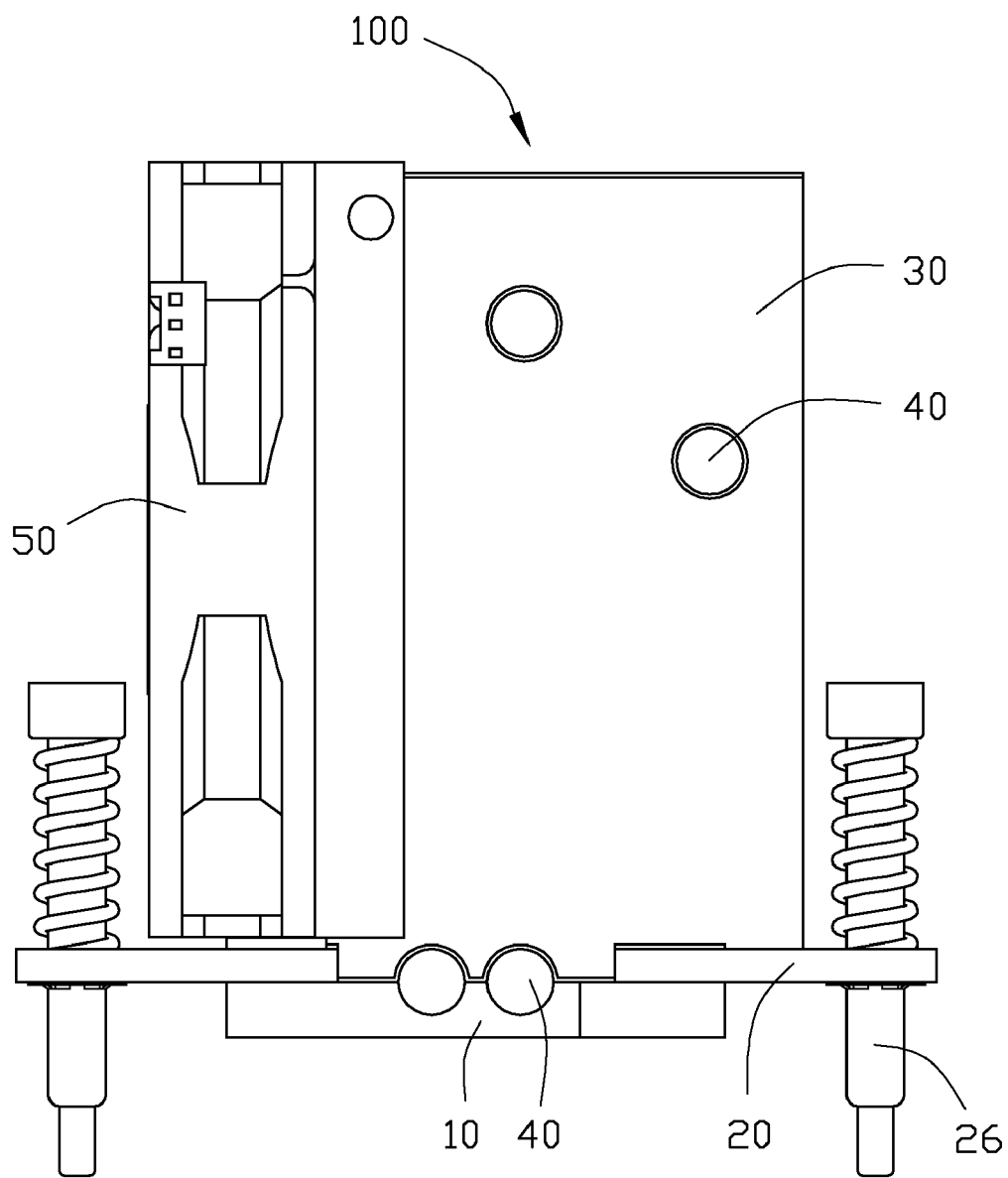
FIG. 3 is an assembly view of FIG. 2.

Referring also to FIG. 3, when assembling the heat dissipation device 100, the two foot members 20 are first attached to the base plate 10 with the rivet 28 or other similar attaching means. The two heat pipes 40 are attached to the fin assembly 30 with their bottom portions received in the corresponding channels 38. Then the base plate 10 and the foot members 20 are attached to the bottom surface 32 of the fin assembly 30. The middle portion of the top surface 12 of the base plate 10 is directly contacted with the bottom surface 32, and an outer side of the bottom portion of the heat pipe 40 is received in the corresponding channels 18. The foot members 20 are respectively positioned into the corresponding indented portions 322, 324 of the fin assembly 30 with the bottom surface 24 of each foot member 20 aligned with the bottom surface 32 of the fin assembly in one plane. The base plate 10 and the foot members 20 are jointed with the bottom surface 32 of the fin assembly 30 in the preferred embodiment of the present invention. The fan 50, for generating airflow through the spaces between the fins, is attached to one side of the fin assembly 30. When used, the heat dissipation device 100 is attached to an electronic device for heat dissipation via the fasteners 26 engaging with a circuit board (not shown) on which the electronic device is installed.

In the preferred embodiment of the present invention, the base plate 10 and the foot members 20 can be incorporated in a base assembly. A cavity is enclosed by the two foot members 20 and the base plate 10 for receiving the bottom projecting portion of the fin assembly.

It is to be understood, however, that even though numerous characteristics and advantages have been set forth in the foregoing description of a preferred embodiment, together with details of the structure and function of the preferred embodiment, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for cooling a heat generating element, the heat dissipation device comprising:
   a base plate, a top surface of the base plate defining at least one first channel therein;
   a fin assembly having a first bottom surface, at least one second channel defined in the first bottom surface corresponding to the at least one first channel, at least one indented portion defined in the first bottom surface;
   at least one heat pipe received in the first channel and the second channel, and attached through the fin assembly; and
   at least one foot member attached to the base plate, the at least one foot member having a second bottom surface, and the at least one foot member being received in the indented portion of the first bottom surface;
   wherein the top surface of the base plate touches the first bottom surface and the second bottom surface.

2. The heat dissipation device as described in claim 1, wherein the at least one foot member comprises at least one generally "C" shaped foot member.

3. The heat dissipation device as described in claim 1, wherein the base plate has a generally rectangular shape, and at least one corner portion of the base plate is cutoff therefrom.

4. The heat dissipation device as described in claim 1, wherein a plurality of fasteners extends through the at least one foot member for fastening the base plate to the heat generating element.

5. The heat dissipation device as described in claim 1, wherein the at least one heat pipe comprises at least one substantially U-shaped heat pipe.

6. The heat dissipation device as described in claim 1, wherein the fin assembly comprises a plurality of substantially planar fins disposed in a substantially perpendicular orientation to the base plate.

7. A heat dissipation device assembly for cooling a heat generating element, the dissipation device assembly comprising:
   at least one fan for creating an airflow;
   a fin assembly disposed within the path of the airflow, a projecting portion formed on a bottom surface of the fin assembly, the projecting portion having a first bottom surface;
   a base assembly comprising:
      a heat-conductive base plate, a bottom surface of the base plate having approximately a same size and shape as an exposed surface of the heat generating element;
      at least one foot member disposed on a top surface of the base plate;
      a cavity cooperatively defined by the base plate and the at least one foot member for receiving the projecting portion of the fin assembly; and
      at least one heat pipe received between the first bottom surface and the top surface of the base plate;
   wherein the top surface of the base plate touches with the first bottom surface directly, and the at least one foot member is embedded into the fin assembly.

8. The heat dissipation device assembly as described in claim 7, wherein the at least one foot member comprises two foot members aligned at opposite sides of the base plate, and each foot member is generally "C" shaped.

9. The heat dissipation device assembly as described in claim 7, wherein the base plate has a generally rectangular shape, and at least one corner portion of the base plate is cutoff.

10. The heat dissipation device assembly as described in claim 7, wherein a plurality of fasteners attached to the at least one foot member for fastening the base plate to the heat generating element.

11. The heat dissipation device assembly as described in claim 7, wherein the at least one heat pipe comprises at least one substantially U-shaped heat pipe.

12. The heat dissipation device assembly as described in claim 7, wherein the fin assembly comprises a plurality of substantially planar fins disposed in a substantially perpendicular orientation to the base plate.

13. The heat dissipation device assembly as described in claim 7, wherein the base plate defines at least one first channel, and the first bottom surface defines at least one second channel, the first channel and the second channel are coupled for receiving the at least one heat pipe.

14. A heat dissipation device assembly comprising:
   a base plate having a bottom surface configured for contacting with a heat generating component and a top surface opposing to the bottom surface;
   a pair of foot members disposed on the top surface of the base plate with a cavity formed therebetween;
   a fin assembly mounted on the base plate and comprising a plurality of fins each having at a bottom side thereof a projecting portion and a recess communicating with the projection portion at one side of the projecting portion, the projecting portions of the fins being received in the cavity and one of the foot members being received in the recess; and
   at least one heat pipe having one portion attached to the base plate and another portion extending into the fin assembly.

15. The heat dissipation device assembly as described in claim 14, wherein the bottommost sides of the projecting portions of the fins are coplanar.

16. The heat dissipation device assembly as described in claim 14, wherein the projecting portions of the fins are sandwiched between the pair of foot members in a direction parallel to the bottom surface and the one of the foot members is sandwiched between the fins and base plate at the recess in another direction perpendicular to the bottom surface.

17. The heat dissipation device assembly as described in claim 16, wherein each of the fins further comprises another recess communicating with the projection portion at an opposite side of the projecting portion, the other one of the foot members being sandwiched between the fins and the base plate in said another recess.

18. The heat dissipation device assembly as described in claim 17, further comprising a fan attached to one lateral side of the fins adjacent to said another recess, wherein said another recess has a smaller size than that of the recess in the direction parallel to the bottom surface.

19. The heat dissipation device assembly as described in claim 17, wherein each of the foot members has a generally C shape, and one portion of each of the foot members sandwiched between the fins and the base plate is generally parallel to the portion of the at least one heat pipe attached to the base plate.

* * * * *